US010867989B2

(12) United States Patent
Lin et al.

(10) Patent No.: US 10,867,989 B2
(45) Date of Patent: Dec. 15, 2020

(54) DRIVING CIRCUIT HAVING ELECTROSTATIC DISCHARGE PROTECTION

(71) Applicant: Vanguard International Semiconductor Corporation, Hsinchu (TW)

(72) Inventors: Chih-Hsuan Lin, Hsinchu (TW); Shao-Chang Huang, Hsinchu (TW); Chun-Chih Chen, New Taipei (TW); Hwa-Chyi Chiou, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 242 days.

(21) Appl. No.: 16/048,588

(22) Filed: Jul. 30, 2018

(65) Prior Publication Data

US 2020/0036376 A1    Jan. 30, 2020

(51) Int. Cl.
*H01L 27/02* (2006.01)
*H02H 9/04* (2006.01)
*H02H 1/00* (2006.01)

(52) U.S. Cl.
CPC ...... *H01L 27/0266* (2013.01); *H01L 27/0248* (2013.01); *H02H 9/046* (2013.01);
(Continued)

(58) Field of Classification Search
CPC ............. H01L 27/0255; H01L 27/0248; H01L 27/0266; H01L 27/0281; H01L 27/0292;
(Continued)

(56) References Cited

U.S. PATENT DOCUMENTS

2008/0030910 A1* 2/2008 Fairgrieve ........ H03K 17/08146
361/56
2008/0316660 A1* 12/2008 Huang ................... H02H 9/046
361/56
(Continued)

FOREIGN PATENT DOCUMENTS

TW  200410394 A   6/2004
TW  201431234 A   8/2014
(Continued)

OTHER PUBLICATIONS

Taiwanese Notice of Allowance and Search Report dated Feb. 13, 2019 for Application No. 107120164.

*Primary Examiner* — Jue Zhang
*Assistant Examiner* — David A. Singh
(74) *Attorney, Agent, or Firm* — Birch, Stewart, Kolasch & Birch, LLP

(57) ABSTRACT

A driving circuit including a detection circuit, a first control circuit, a second control circuit, and a driving transistor is provided. The detection circuit is coupled between a first power terminal and a second power terminal and generates a detection signal according to the voltages of the first and second power terminals. The first control circuit generates a first control signal according to the detection signal. The second control circuit generates a second control signal according to the detection signal. The driving transistor is coupled between an input-output pad and the second power terminal. When the detection signal is at a first level, the driving transistor is turned on according to the first control signal. When the detection signal is at a second level, the driving transistor is configured to operate according to the second control signal. The first level is different from the second level.

12 Claims, 4 Drawing Sheets

(52) U.S. Cl.
CPC ........ *H01L 27/0281* (2013.01); *H02H 1/0007* (2013.01); *H02H 9/04* (2013.01)

(58) Field of Classification Search
CPC .......... H01L 27/0296; H03K 17/08122; H03K 17/223; H02H 1/0007; H02H 9/046; H02H 9/04
USPC .................................................. 361/139–144
See application file for complete search history.

(56) References Cited

U.S. PATENT DOCUMENTS

| | | | |
|---|---|---|---|
| 2009/0086392 A1* | 4/2009 | Ker ........................ | H02H 9/046 361/56 |
| 2009/0166671 A1* | 7/2009 | Hwang ............... | H01L 27/0262 257/137 |
| 2010/0208398 A1 | 8/2010 | Jou | |
| 2013/0293993 A1* | 11/2013 | Chen ............. | H03K 19/018521 361/56 |
| 2015/0249334 A1* | 9/2015 | Chen ..................... | H02H 9/046 361/56 |
| 2015/0333508 A1* | 11/2015 | Ko ........................ | H02H 9/046 361/56 |
| 2016/0241020 A1* | 8/2016 | Tseng ....................... | H02H 9/04 |
| 2017/0033557 A1* | 2/2017 | Chu ....................... | H02H 9/046 |
| 2018/0019741 A1* | 1/2018 | Huang ............... | H03K 17/0822 |
| 2018/0159323 A1* | 6/2018 | Huang .................. | H02H 9/046 |

FOREIGN PATENT DOCUMENTS

| | | |
|---|---|---|
| TW | 201445700 A | 12/2014 |
| TW | 201733072 A | 9/2017 |

\* cited by examiner

DRIVING CIRCUIT HAVING ELECTROSTATIC DISCHARGE PROTECTION

BACKGROUND OF THE INVENTION

Field of the Invention

The invention relates to a driving circuit, and more particularly to a driving circuit having an electrostatic discharge (ESD) protection function.

Description of the Related Art

As the processes used in semiconductor manufacturing develop, electrostatic discharge (ESD) protection has become one of the most critical reliability issues for integrated circuits (IC). In particular, as semiconductor processing advances into the deep sub-micron stage, scaled-down devices and thinner gate oxides are more vulnerable to ESD stress.

BRIEF SUMMARY OF THE INVENTION

In accordance with an embodiment, a driving circuit comprises a detection circuit, a first control circuit, a second control circuit, and a driving transistor. The detection circuit is coupled between a first power terminal and a second power terminal and generates a detection signal according to the voltages of the first and second power terminals. The first control circuit generates a first control signal according to the detection signal. The second control circuit generates a second control signal according to the detection signal. The driving transistor is coupled between an input-output pad and the second power terminal. In response to the detection signal being at a first level, the driving transistor is turned on according to the first control signal. In response to the detection signal being at a second level, the driving transistor is configured to operate according to the second control signal. The first level is different from the second level.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
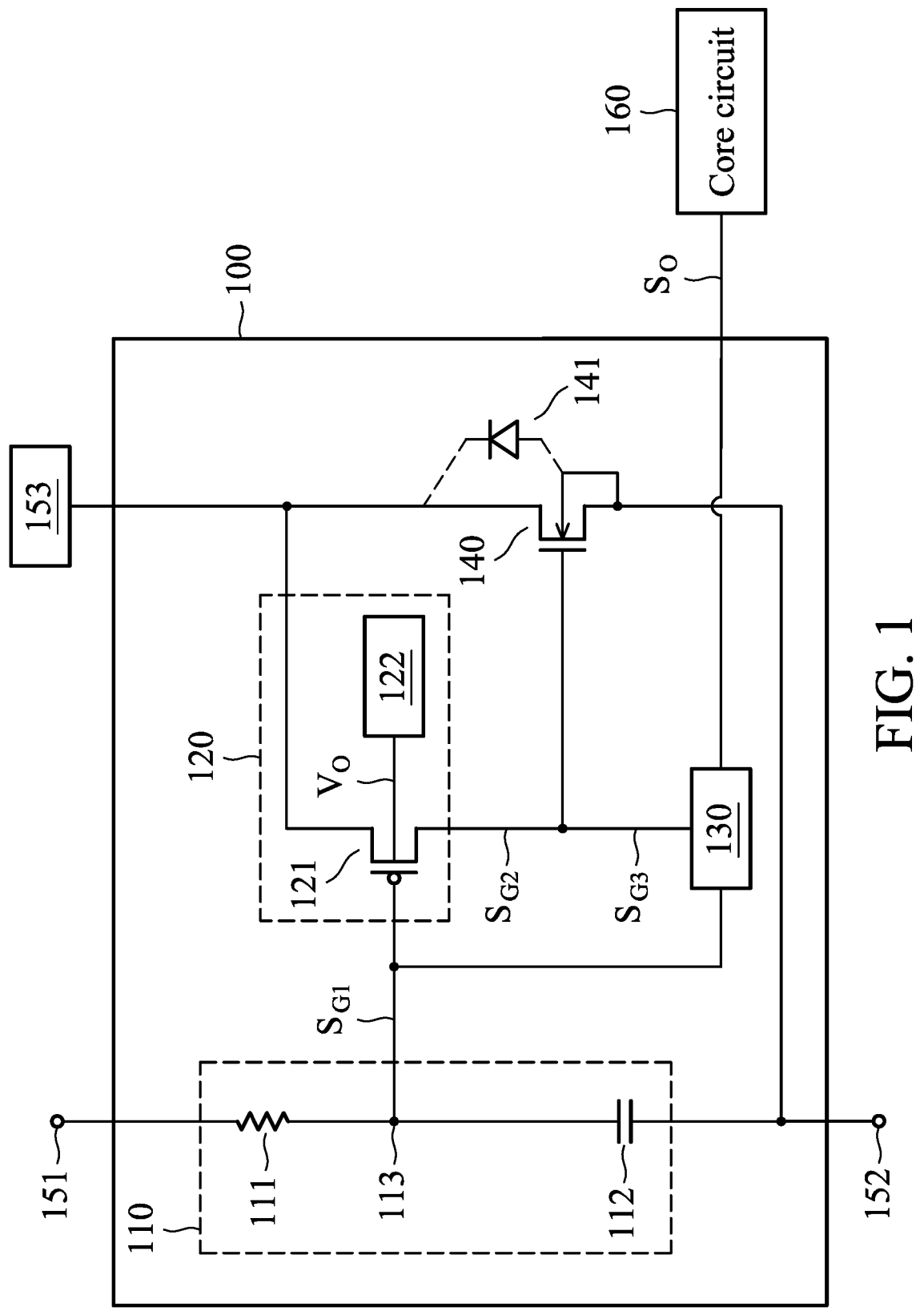
FIG. 1 is a schematic diagram of an exemplary embodiment of a driving circuit, according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of a driving circuit, according to various aspects of the present disclosure. The driving circuit 100 is coupled to power terminals 151 and 152 and an input-output pad 153. When the power terminal 151 receives a high operation voltage (e.g. 5V) and the power terminal 152 receives a low operation voltage (e.g. 0V), the driving circuit 100 operates in a normal mode. In the normal mode, the driving circuit 100 drives an external circuit coupled to the input-output pad 153 according to an output signal $S_O$ generated by a core circuit 160. In one embodiment, the external circuit may be an array device.

However, when the power terminal 152 receives a ground voltage and the power terminal 151 is at a floating potential, the driving circuit 100 enters a protection mode. In the protection mode, the driving circuit 100 is capable of releasing an electrostatic discharge (ESD) current from the input-output pad 153 or the power terminal 152. For example, when a positive ESD voltage occurs at the power terminal 153 and the power terminal 152 is grounded, the driving circuit 100 releases an ESD current from the input-output pad 153 to the power terminal 152. When a negative ESD voltage occurs at the input-output pad 153 and the power terminal 152 is grounded, the driving circuit 100 releases an ESD current from the power terminal 152 to the input-output pad 153.

In this embodiment, the driving circuit 100 comprises a detection circuit 110, control circuits 120 and 130, a driving transistor 140. The detection circuit 110 is coupled between the power terminals 151 and 152 and generates a detection signal $S_{G1}$ according to the voltages of the power terminals 151 and 152. In one embodiment, when the voltage of the power terminal 152 is a ground voltage and the power terminal 151 is at a floating potential, the detection circuit 110 sets the detection signal $S_{G1}$ to a first level, such as a low level. In another embodiment, when the power terminal 151 receives an operation voltage (e.g. 5V) and the power terminal 152 receives a ground voltage, the detection circuit 110 sets the detection signal $S_{G1}$ to a second level, such as a high level.

The circuit structure of the detection circuit 110 is not limited in the present disclosure. In this embodiment, the detection circuit 110 comprises a resistor 111 and a capacitor 112. The resistor 111 is coupled between the power terminal 151 and a common node 113. The capacitor 112 is coupled between the common node 113 and the power terminal 152. In this case, when the power terminal 152 receives a ground voltage and the power terminal 151 is at a floating potential, the level of the common node 113 is a low level. In other words, the detection signal $S_{G1}$ is at a low level. In another embodiment, when the power terminal 151 receives a first operation voltage (e.g. 5V) and the power terminal 152 receives a second operation voltage (e.g. a ground voltage), the level of the common node 113 is a high level. In other words, the detection signal $S_{G1}$ is at a high level.

The control circuit 120 generates a control signal $S_{G2}$ according to the detection signal $S_{G1}$. For example, when the detection signal $S_{G1}$ is at a first level (e.g. a low level), the control circuit 120 sets the control signal $S_{G2}$ to a third level. In one embodiment, the third level may be equal to the voltage of the input-output pad 153. However, when the detection signal $S_{G1}$ is at the second level (e.g. a high level), the control circuit 120 stops providing the control signal $S_{G2}$. At this time, the control signal $S_{G2}$ may be at a floating level.

The circuit structure of the control circuit 120 is not limited in the present disclosure. In one embodiment, the control circuit 120 comprises a P-type transistor 121 and a voltage generator circuit 122. The gate of the P-type transistor 121 is coupled to the common node 113. The source of the P-type transistor 121 is coupled to the input-output pad 153. The drain of the P-type transistor 121 is coupled to the gate of the driving transistor 140. The bulk of the P-type transistor 121 receives an output voltage $V_O$. In one embodiment, the output voltage $V_O$ is a high voltage. For example, the output voltage $V_O$ may be approximate equal to the voltage of the input-output pad 153.

The voltage generator circuit 122 is configured to generate a high voltage to the bulk of the P-type transistor 121 to avoid a leakage current passing through the P-type transistor 121. In one embodiment, the voltage generator circuit 122 generates the output voltage $V_O$ according to the voltages of the power terminal 151 and the input-output pad 153. For example, when the voltage of the power terminal 151 is higher than the voltage of the input-output pad 153, the voltage generator circuit 122 outputs the voltage of the power terminal 151 to the bulk of the P-type transistor 121. When the voltage of the input-output pad 153 is higher than the voltage of the power terminal 151, the voltage generator circuit 122 provides the voltage of the input-output pad 153 to the bulk of the P-type transistor 121. The circuit structure of the voltage generator circuit 122 is not limited in the present disclosure. The operating configuration of the voltage generator circuit 122 is described in greater detail with reference to FIG. 2.

The control circuit 130 generates a control signal $S_{G3}$ according to the detection signal $S_{G1}$. In this embodiment, the control circuit 130 is coupled between the detection circuit 110 and the cores circuit 160 and provides the control signal $S_{G3}$ to the gate of the driving transistor 140. When the detection signal $S_{G1}$ is at the second level (e.g. a high level), the control circuit 130 serves the output signal $S_O$ generated by the core circuit 160 as the control signal $S_{G3}$ and provides the control signal $S_{G3}$ to the driving transistor 140. When the detection signal $S_{G1}$ is at the first level (e.g. a low level), the control circuit 130 stops serving the output signal $S_O$ as the control signal $S_{G3}$. At this time, the control signal $S_{G3}$ may be at a floating level.

The circuit structure of the control circuit 130 is not limited in the present disclosure. In one embodiment, the control circuit 130 comprises a transmission gate. In this case, when the detection signal $S_{G1}$ is at a high level, the transmission gate is turned on to transmit the output signal $S_O$ as the control signal $S_{G3}$ to the driving transistor 140. When the detection signal $S_{G1}$ is at a low level, the transmission gate is not turned on to avoid an ESD current passing through the core circuit 160. In other embodiments, when the core circuit 160 comprises a protection circuit to avoid an ESD voltage, the control circuit 130 can be omitted. In this case, the core circuit 160 is directly connected to the driving transistor 140.

Additionally, the circuit structure of the core circuit 160 is not limited in the present disclosure. In one embodiment, when the output signal $S_O$ is at a high level, the control signal $S_{G3}$ is also at the high level. When the output signal $S_O$ is a low level, the control signal $S_{G3}$ is also at the low level. In other embodiments, the level of the output signal $S_O$ is opposite to the level of the control signal $S_{G3}$. For example, when the output signal $S_O$ is at a high level, the control signal $S_{G3}$ is at a low level. When the output signal $S_O$ is at a low level, the control signal $S_{G3}$ is at a high level.

The driving transistor 140 is coupled between the input-output pad 153 and the power terminal 152. When the power terminal 152 receives a ground voltage and the power terminal 151 has a floating voltage, the detection signal $S_{G1}$ is at a low level. When the level of the input-output pad 153 is higher than the detection signal $S_{G1}$, the P-type transistor 121 is turned on. At this time, when the input-output pad 153 receives a positive ESD voltage, the control signal $S_{G2}$ is at a high level. Therefore, the driving transistor 140 is turned on to release ESD current from the input-output pad 153 to the power terminal 152. However, when the input-output pad 153 receives a negative ESD voltage and the power terminal 152 receives a ground voltage, a parasitical diode 141 of the driving transistor 140 is turned on to release the ESD current.

When the power terminal 151 receives a first operation voltage (e.g. 5V) and the power terminal 152 receives a second operation voltage (e.g. a ground voltage), the detection signal $S_{G1}$ is at the second level (e.g. a high level). At this time, the control signal $S_{G2}$ is not controlled by the control circuit 120 and the driving transistor 140 operates according to the control signal $S_{G3}$. For example, when the control signal $S_{G3}$ is at a fourth level, the driving transistor 140 is not turned on. When the control signal $S_{G3}$ is at a fifth level, the driving transistor 140 is turned on to provide a driving current (not shown). Since the size of the channel width of the driving transistor 140 is large, the driving capability of the driving transistor 140 is large. In this embodiment, the driving transistor 140 is an N-type transistor. The gate of the driving transistor 140 is coupled to the control circuits 120 and 130. The source of the driving transistor 140 is coupled to the input-output pad 153. The drain and the bulk of the driving transistor 140 are coupled to the power terminal 152.

Figure 2:
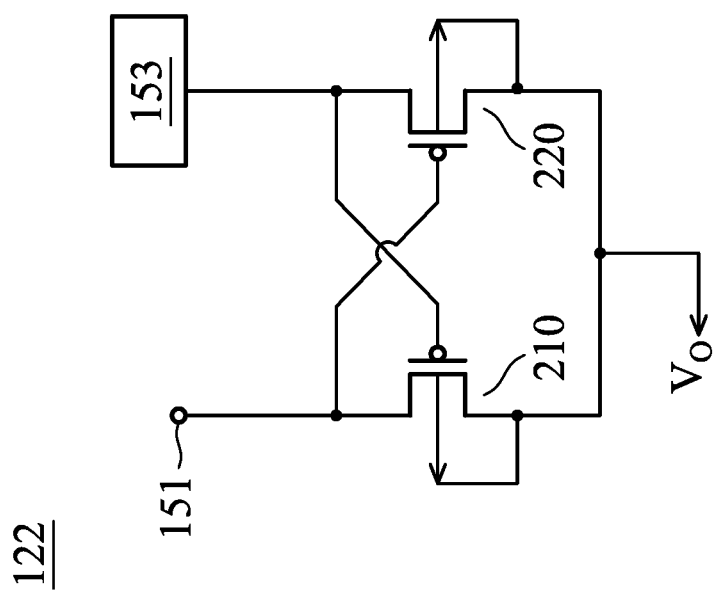
FIG. 2 is a schematic diagram of an exemplary embodiment of a voltage generator circuit, according to various aspects of the present disclosure.

FIG. 2 is a schematic diagram of a voltage generator circuit in an exemplary embodiment, according to various aspects of the present disclosure. In this embodiment, the voltage generator circuit 122 comprises P-type transistors 210 and 220. The gate of the P-type transistor 210 is coupled to the input-output pad 153. The source of the P-type transistor 210 is coupled to the power terminal 151. The drain and the bulk of the P-type transistor 210 are coupled to the bulk of the P-type transistor 121. When the voltage of the input-output pad 153 is lower than the voltage of the power terminal 151, the P-type transistor 210 is turned on to serve the voltage of the power terminal 151 as the output voltage $V_O$.

The gate of the P-type transistor 220 is coupled to the power terminal 151. The source of the P-type transistor 220 is coupled to the input-output pad 153. The drain and the bulk of the P-type transistor 220 are coupled to the bulk of the P-type transistor 121. In this embodiment, when the voltage of the power terminal 151 is lower than the voltage of the input-output pad 153, the P-type transistor 220 is turned on to provide the voltage of the 153 as the output voltage $V_O$.

Figure 3:
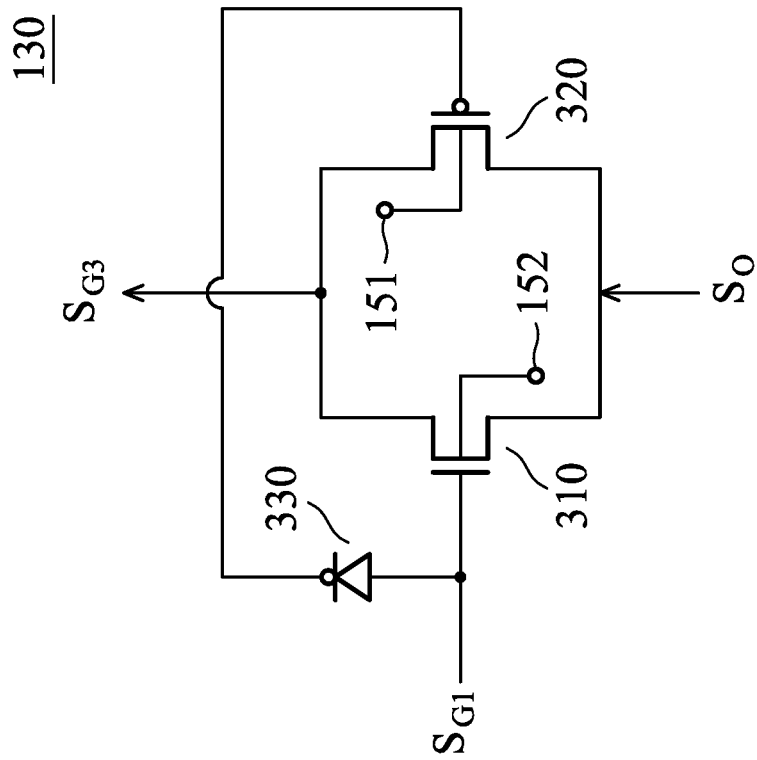
FIG. 3 is a schematic diagram of an exemplary embodiment of a control circuit, according to various aspects of the present disclosure.

FIG. 3 is a schematic diagram of a control circuit in an exemplary embodiment, according to various aspects of the present disclosure. The control circuit 130 comprises an N-type transistor 310, a P-type transistor 320 and an inverter 330. The gate of the N-type transistor 310 is coupled to the input terminal of the inverter 330 and receives the detection signal $S_{G1}$. The drain of the N-type transistor 310 receives the output signal $S_O$. The source of the N-type transistor 310 is coupled to the gate of the driving transistor 140. The bulk of the N-type transistor 310 is coupled to the power terminal 152. In this embodiment, when the detection signal $S_{G1}$ is at the second level (e.g. a high level) and the output signal $S_O$ is at a low level, the N-type transistor 310 is turned on to provide the output signal $S_O$ as the control signal $S_{G3}$ to the driving transistor 140. However, when the detection signal $S_{G1}$ is at the first level (e.g. a low level), the N-type transistor 310 is not turned on.

The gate of the P-type transistor 320 is coupled to the output terminal of the inverter 330. The source of the P-type transistor 320 receives the output signal $S_O$. The drain of the P-type transistor 320 is coupled to the gate of the driving transistor 140. The bulk of the P-type transistor 320 is coupled to the power terminal 151. In this embodiment, when the detection signal $S_{G1}$ is at the second level (e.g. a high level) and the output signal $S_O$ is at a high level, the P-type transistor 320 is turned on to provide the output signal $S_O$ as the control signal $S_{G3}$ to the driving transistor 140. However, when the detection signal $S_{G1}$ is at the first level (e.g. a low level), the P-type transistor 320 is turned off.

Figure 4:
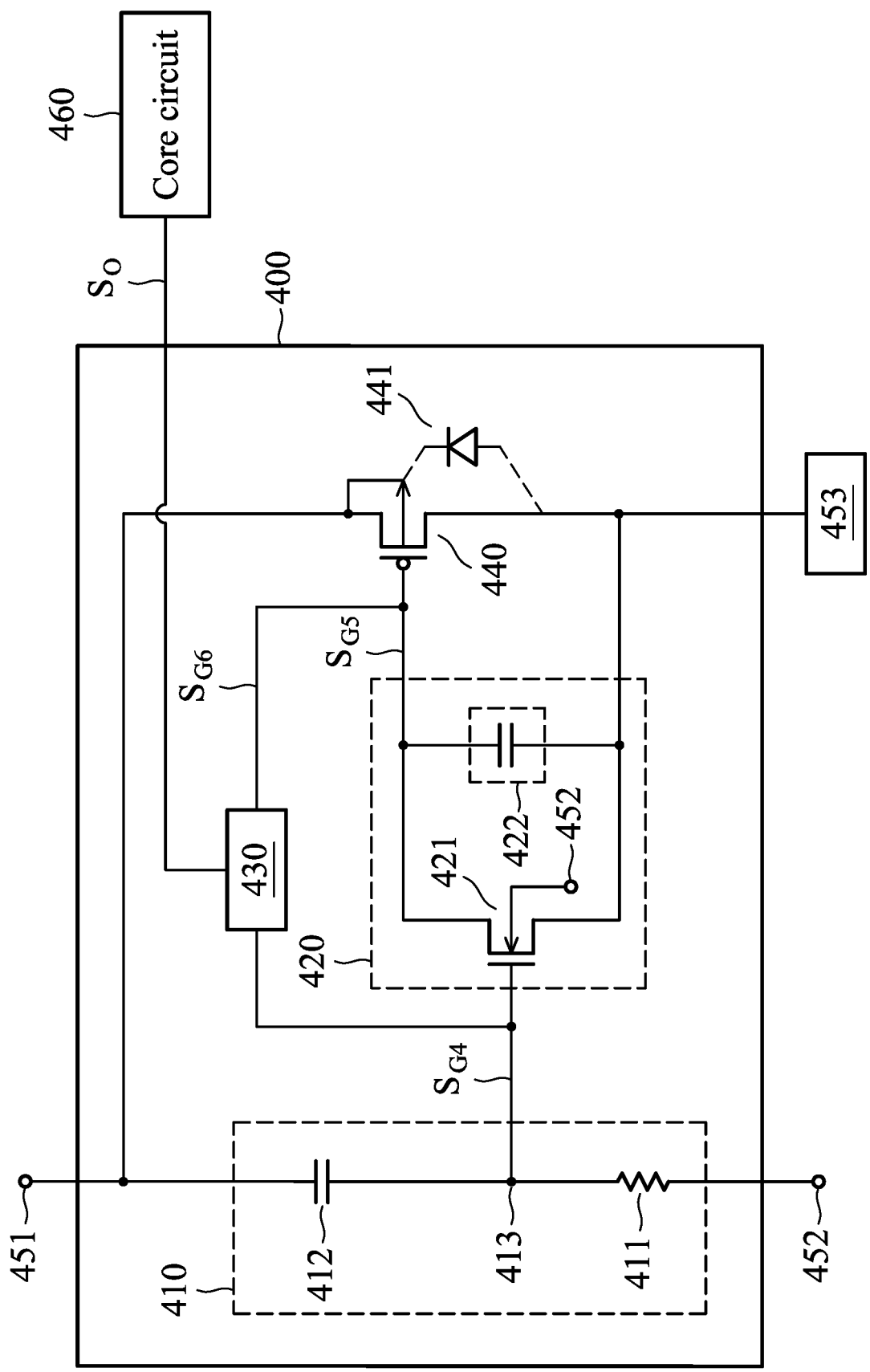
FIG. 4 is a schematic diagram of another exemplary embodiment of a driving circuit, according to various aspects of the present disclosure.

FIG. 4 is a schematic diagram of a driving circuit in an embodiment, according to various aspects of the present disclosure. The driving circuit 400 is coupled to the power terminals 451 and 452 and an input-output pad 453. When the power terminal 451 receives a high operation voltage (e.g. 5V) and the power terminal 452 receives a low operation voltage (e.g. 0V), the driving circuit 400 operates in a normal mode. In the normal mode, the driving circuit 400 drives a load (not shown) according to the output signal $S_O$ generated by the core circuit 460. However, when the power terminal 451 receives a ground voltage and the power terminal 452 has a floating voltage, the driving circuit 400 operates in a protection mode. In the protection mode, when an ESD event occurs at the power terminal 451 or the input-output pad 453, the driving circuit 400 releases the ESD current from the power terminal 451 or the input-output pad 453.

In this embodiment, the driving circuit 400 comprises a detection circuit 410, control circuits 420 and 430 and a driving transistor 440. The detection circuit 410 is coupled between the power terminals 451 and 452 and generates a detection signal $S_{G4}$ according to the voltages of the power terminals 451 and 452. In one embodiment, when the power terminal 451 receives a first operation voltage (e.g. 5V) and the power terminal 452 receives a second operation voltage (e.g. a ground voltage), the detection circuit 410 sets the detection signal $S_{G4}$ at a low level. In another embodiment, when the voltage of the power terminal 451 is a ground voltage and the power terminal 452 has a floating voltage, the detection circuit 410 also sets the detection signal $S_{G4}$ at a low level.

The circuit structure of the detection circuit 410 is not limited in the present disclosure. In one embodiment, the detection circuit 410 comprises a resistor 411 and a capacitor 412. The resistor 411 is coupled between the power terminal 452 and a common node 413. The capacitor 412 is coupled between the common node 413 and the power terminal 451. In this case, when the power terminal 451 receives a ground voltage and the power terminal 452 is at a floating potential, the voltage of the common node 413 is at a low level. Therefore, the detection signal $S_{G4}$ is also at the low level. In another embodiment, when the power terminal 451 receives a first operation voltage (e.g. 5V) and the power terminal 452 receives a second operation voltage (e.g. a ground voltage), the common node 413 is at a low level. In this case, the detection signal $S_{G4}$ is at the low level.

The control circuit 420 generates a control signal $S_{G5}$ according to the detection signal $S_{G4}$. For example, when the power terminal 451 receives a ground voltage and the power terminal 452 is at a floating potential, if the input-output pad 453 receives a negative ESD voltage, the control circuit 420 sets the control signal $S_{G5}$ at a third level, such as a low level. In one embodiment, the third level may be equal to the voltage of the input-output pad 453. However, when the power terminal 451 receives a first operation voltage (e.g. 5V) and the power terminal 452 receives a second operation voltage (e.g. a ground voltage), the control circuit 420 stops provides the control signal $S_{G5}$. At this time, the control signal $S_{G5}$ may be at a floating level.

In the present disclosure, the circuit structure of the control circuit 420 is not limited. In one embodiment, the control circuit 420 comprises an N-type transistor 421 and a coupling element 422. The gate of the N-type transistor 421 is coupled to the common node 413. The source of the N-type transistor 421 is coupled to the input-output pad 453. The drain of the N-type transistor 421 is coupled to the gate of the driving transistor 440. The bulk of the N-type transistor 421 is coupled to the power terminal 452. The coupling element 422 is coupled between the gate of the driving transistor 440 and the input-output pad 453. In one embodiment, the coupling element 422 is a capacitor. When the input-output pad 453 receives a negative ESD voltage, the coupling element 422 pulls down the level of the control signal $S_{G5}$. In another embodiment, when the N-type transistor 421 is turned on, the level of the control signal $S_{G5}$ can be pulled down. In one embodiment, the control signal $S_{G5}$ is approximate equal to the level of the input-output pad 453.

The control circuit 430 generates a control signal $S_{G6}$ according to the detection signal $S_{G4}$ and the levels of the power terminals 451 and 452. In this embodiment, the control circuit 430 is coupled between the gate of the driving transistor 440 and the detection circuit 410 and receives the output signal $S_O$ generated by the core circuit 460. In one embodiment, when the power terminal 451 receives a first operation voltage (e.g. 5V) and the power terminal 452 is grounded, the detection signal $S_{G4}$ is at a low level. At this time, the control circuit 430 serves the output signal $S_O$ generated by the core circuit 460 as the control signal $S_{G6}$ to the driving transistor 440. However, when the power terminal 451 is grounded, the power terminal 452 is floating, if an ESD event occurs at the input-output pad 453, the control circuit 430 stops serving the output signal $S_O$ as the control signal $S_{G6}$. At this time, the control signal $S_{G6}$ may be a floating voltage. The circuit structure of the control circuit 430 is not limited in the present disclosure. The operating configuration of the control circuit 430 is described in greater detail with reference to FIG. 5. Furthermore, the features of the core circuit 460 are the same as the features of the core circuit 160 shown in FIG. 1, the description of the core circuit 460 is omitted for brevity.

The driving transistor 440 is coupled between the input-output pad 453 and the power terminal 451. When the power terminal 451 receives a ground voltage and the power terminal 452 has a floating voltage, the detection signal $S_{G4}$ is at a low level. At this time, if the input-output pad 453 receives a negative ESD voltage, since the voltage of the source of the N-type transistor 421 is lower than the voltage of the gate of the N-type transistor 421, the N-type transistor 421 is turned on and the coupling element 422 pulls down the level of the control signal $S_{G5}$. Since the control signal $S_{G5}$ is at a low level, the driving transistor 440 is turned on to release the ESD current. However, if the input-output pad 453 receives a positive ESD voltage and the power terminal 151 receives a ground voltage, the parasitic diode 441 of the driving transistor 440 is turned on to release the ESD current to ground.

When the power terminal 451 receives a first operation voltage (e.g. 5V) and the power terminal 452 receives a second operation voltage (e.g. a ground voltage), the voltages of the gate and the bulk of the N-type transistor 421 are approximate equal to the second operation voltage. Therefore, the N-type transistor 421 is turned off. At this time, the control signal $S_{G5}$ is a floating voltage. In this case, the driving transistor 440 operates according to the control signal $S_{G6}$. For example, when the control signal $S_{G6}$ is at a fourth level (e.g. a high level), the driving transistor 440 is turned off. When the control signal $S_{G6}$ is at a fifth level (e.g. a low level), the driving transistor 440 is turned on. Since the channel width of the driving transistor 440 is large, the driving capability of the driving transistor 440 is a large. Therefore, the driving transistor 440 is capable of providing a large current.

In this embodiment, the driving transistor 440 is a P-type transistor. The gate of the driving transistor 440 is coupled to the control circuits 420 and 430. The drain of the driving transistor is coupled to the input-output pad 453. The source and the bulk of the driving transistor 440 are coupled to the power terminal 451.

Figure 5:
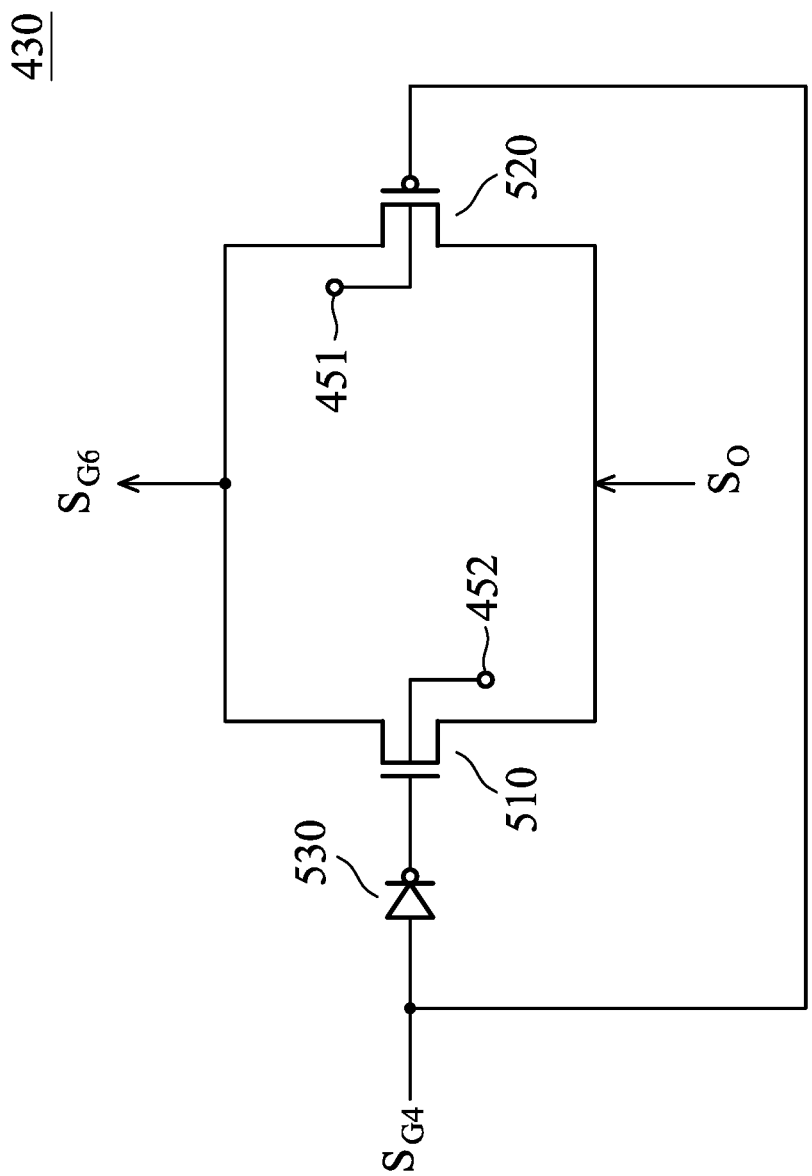
FIG. 5 is a schematic diagram of another exemplary embodiment of a control circuit, according to various aspects of the present disclosure.

FIG. 5 is a schematic diagram of another exemplary embodiment of the control circuit shown in FIG. 4 according to various aspects of the present disclosure. The control circuit 430 comprises an N-type transistor 510, a P-type transistor 520 and an inverter 530. The input terminal of the inverter 530 receives the detection signal $S_{G4}$. The output terminal of the inverter 530 is coupled to the gate of the N-type transistor 510. In one embodiment, when the power terminal 451 receives a first operation voltage (e.g. 5V) and the power terminal 452 receives a second operation voltage (e.g. 0V), the inverter 530 is activated to invert the detection signal $S_{G4}$. In another embodiment, when the power terminal 451 is grounded and the power terminal 452 is floating, the inverter 530 is de-activated to stop inverting the detection signal $S_{G4}$. Therefore, the output of the inverter 530 is at a floating level.

The drain of the N-type transistor 510 receives the output signal $S_O$. The source of the N-type transistor 510 is coupled to the gate of the driving transistor 440. The bulk of the N-type transistor 510 is coupled to the power terminal 452. The gate of the P-type transistor 520 is coupled to the input terminal of the inverter 530. The source of the P-type transistor 520 receives the output signal $S_O$. The drain of the P-type transistor 520 is coupled to the gate of the driving transistor 440. The bulk of the P-type transistor 520 is coupled to the power terminal 451.

When the power terminal 451 receives a first operation voltage (e.g. 5V) and the power terminal 452 receives a second operation voltage (e.g. 0V), the detection signal $S_{G4}$ is at a low level. The the inverter 530 inverts the detection signal $S_{G4}$ to provide a high level to turn on the N-type transistor 510. At this time, when the core circuit 460 generates the output signal $S_O$, the P-type transistor 520 is turned on. The N-type transistor 510 and the P-type transistor 520 are turned on to provide the output signal $S_O$ as the control signal $S_{G6}$ to the driving transistor 440. When the power terminal 451 is grounded and the power terminal 452 is floating, the inverter 530 is deactivated. Since the output of the inverter 530 is at a floating level, the N-type transistor 510 is turned off. At this time, since the core circuit 460 stops generating the output signal $S_O$, the output signal $S_O$ is at a floating level. Therefore, the P-type transistor 520 is turned off. Since the N-type transistor 510 and the P-type transistor 520 are turned off, the control signal $S_{G6}$ is at a floating level.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A driving circuit comprising:
   a detection circuit coupled between a first power terminal and a second power terminal and generating a detection signal according to voltages of the first and second power terminals;
   a first control circuit generating a first control signal according to the detection signal;
   a second control circuit generating a second control signal according to the detection signal; and
   a driving transistor coupled between an input-output pad and the second power terminal,
   wherein in response to the detection signal being at a first level, the driving transistor is turned on according to the first control signal, and in response to the detection signal being at a second level, the driving transistor is configured to operate according to the second control signal, wherein the first level is different from the second level,
   wherein the first control circuit comprises:
   a voltage generator circuit generating an output voltage according to a voltage of the first power terminal and a voltage of the input-output pad; and
   a first P-type transistor comprising a gate coupled to the common node, a source coupled to the input-output pad, a drain coupled to a gate of the N-type transistor and a bulk receiving the output voltage,
   wherein in response to the voltage of the first power terminal being higher than the voltage of the input-output pad, the output voltage is equal to the voltage of the first power terminal.

2. The driving circuit as claimed in claim 1, wherein the driving transistor is an N-type transistor.

3. The driving circuit as claimed in claim 2, wherein the detection circuit comprises:
   a resistor coupled between the first power terminal and a common node; and
   a capacitor coupled between the common node and the second power terminal.

4. The driving circuit as claimed in claim 1, wherein
in response to the voltage of the input-output pad being higher than the voltage of the first power terminal, the output voltage is equal to the voltage of the input-output pad.

5. The driving circuit as claimed in claim 1, wherein the voltage generator circuit comprises:
a second P-type transistor comprising a gate coupled to the input-output pad, a source coupled to the first power terminal, a drain coupled to the bulk of the first P-type transistor, and a bulk coupled to the bulk of the first P-type transistor; and
a third P-type transistor comprising a gate coupled to the first power terminal, a source coupled to the input-output pad, a drain coupled to the bulk of the first P-type transistor and a bulk coupled to the bulk of the first P-type transistor.

6. The driving circuit as claimed in claim 1, wherein the second control circuit comprises:
a transmission gate coupled between the gate of the driving transistor and a core circuit, wherein
in response to the detection signal being at the second level, the transmission gate provides an output signal which is generated by the core circuit and serves as the second control signal to the driving transistor, and
in response to the detection signal being at the first level, the transmission gate stops providing the output signal to the driving transistor.

7. The driving circuit as claimed in claim 6, wherein in response to the detection signal being at the first level, the second control signal is at a floating level.

8. The driving circuit as claimed in claim 1, wherein the second control circuit comprises:
a transmission gate coupled between the gate of the driving transistor and a core circuit, wherein
in response to the detection signal being at the first level, the transmission gate provides an output signal generated by the core circuit and serving as the second control signal to the driving transistor, and
in response to the detection signal being at the second level, the transmission gate stops providing the output signal to the driving transistor.

9. The driving circuit as claimed in claim 8, wherein in response to the detection signal being at the second level, the second control signal is at a floating level.

10. The driving circuit as claimed in claim 1, wherein the gate of the first P-type transistor is directly connected to the common node, the source of the first P-type transistor is directly connected to the input-output pad, the drain of the first P-type transistor is directly connected to the gate of the driving transistor and the second power terminal.

11. A driving circuit comprising:
a detection circuit coupled between a first power terminal and a second power terminal and generating a detection signal according to voltages of the first and second power terminals;
a first control circuit generating a first control signal according to the detection signal;
a second control circuit generating a second control signal according to the detection signal; and
a P-type transistor coupled between an input-output pad and the second power terminal,
wherein in response to the detection signal being at a first level, the P-type transistor is turned on according to the first control signal, and in response to the detection signal being at a second level, the P-type transistor is configured to operate according to the second control signal, wherein the first level is different from the second level,
wherein the detection circuit comprises:
a first capacitor coupled between the first power terminal and a common node; and
a resistor coupled between the common node and the second power terminal,
wherein the first control circuit comprises:
an N-type transistor comprising a gate coupled to the common node, a drain coupled to the gate of the P-type transistor, a source coupled to the input-output pad and a bulk coupled to the first power terminal; and
a coupling element coupled between the gate of the P-type transistor and the input-output pad.

12. The driving circuit as claimed in claim 11, wherein the coupling element is a second capacitor.

* * * * *